METHOD OF MAKING A METAL FOIL PATTERN BY ETCHING

Filed Nov. 22, 1967

INVENTOR.
ADRIAN P. BRIETZKE
BY Bair, Freeman & Molinare
ATTORNEYS

United States Patent Office 3,506,507

Patented Apr. 14, 1970

3,506,507
METHOD OF MAKING A METAL FOIL PATTERN BY ETCHING

Adrian P. Brietzke, Sparta, Wis., assignor to Northern Engraving Company

Continuation-in-part of application Ser. No. 609,389, Jan. 16, 1967. This application Nov. 22, 1967, Ser. No. 685,058
Int. Cl. B32b *31/14;* C23b *3/02*
U.S. Cl. 156—3 4 Claims

ABSTRACT OF THE DISCLOSURE

A process for providing a design pattern in thin metal foil for application to a background support having the steps of (1) temporarily affixing a thin metal foil to a temporary carrier, (2) defining the desired pattern on the metal foil with an etch resistant adhesive, and (3) removing that portion of the metal foil not defining the pattern. This assembly may be attached to a background support to provide a decorative or useful finished product.

Reference to related cases

This invention is a continuation-in-part application of my co-pending application Ser. No. 609,389, filed Jan. 16, 1967.

Background of the invention

This invention relates to a new method of bonding a pattern of metal foil elements to a background material and also to the resultant bonded product.

The application of a metal overlay to a background material is highly desirable for both decorative and functional articles. It is often desirable or necessary to have a pattern composed of many separate pieces of metal foil in a predetermined arrangement. As is well-known in the art, the pattern may be temporarily supported by a temporary adhesive on a backing before transfer to some background material.

In the past, metal foil patterns have been fabricated by conventional etching methods in which the design is applied to the metal foil in a reverse pattern using standard and well known etch resists and application methods. These are either photoresists or printed patterns covered with fused asphaltum or other conventional materials.

Following the etching process, in many cases, it is necessary to remove the resist. This is an undesirable process because the design may consist of a large number of discrete elements all of which must remain in spatial relationship during the removal process to preserve the structure of the design. In addition, solvents which dissolve the resist also attack the temporary adhesive which holds the pattern parts on the backing.

After removal of the resist, a permanent adhesive must be applied to the etched design. Even in cases where it is not necessary to remove the resist, it is still necessary to apply a permanent adhesive for bonding the design to the substrate.

The adhesive must be applied to the reverse side of this transfer or to the substrate. It may be applied discretely to the area of the design in which case an accurate register method must be employed. If the adhesive is not in register it will cover both the design and open areas and will have to be removed after transfer or be left as an alien element on the substrate.

A metal foil decal using the above discussed principles is disclosed in the patent issued on May 14, 1963 to Colfer et al., U.S. Patent No. 3,089,800. While such a product has proven quite satisfactory, certain drawbacks are encountered. As set forth above, one of the most disconcerting drawbacks is the difficulty in maintaining register when placing permanent adhesive on the design pattern before application of the foil design to a background. The presently claimed invention overcomes these drawbacks.

Summary of the invention

The method disclosed incorporates temporarily adhering one surface of a metal foil sheet onto a temporary carrier, then defining on the exposed metal foil sheet surface a desired pattern with an etch resistant adhesive. The metal not covered by the pattern defined on the metal foil is removed from the temporary carrier by etching means. The foil pattern, held in position by the temporary carrier, may then be permanently adhered to a background material. Pressure alone or the combination of heat and pressure may be used to facilitate bonding the design to the background. Finally, the temporary carrier may be removed from the metal foil to expose the design affixed to the background. The article may have a design composed of many separate and distinct parts arranged in predetermined positions or it may be composed of a single patterned element.

It is an object of this invention to provide a method of attaching metal foil designs, both functional and decorative, to almost any possible background.

It is a further object of this invention to provide a method of applying metal foil patterns comprised of separate metal foil elements in a predetermined arrangement to a permanent background.

It is a still further object of the invention to provide a method of bonding metal foil patterns to both flat and curved surfaces.

A further object of the present invention is to provide a metal foil applique with permanent adhesive completely covering the surface of the foil to be bonded. Gaps in the adhesive layer are eliminated.

Still another object is to provide an inexpensive, simplified method of permanently affixing a metal foil design to a background.

A further object is to provide a method of permanently bonding metal foil patterns to a flexible background to produce a flexible, decorative material which may be used for interior trim in automobiles.

These and other objects, advantages and features will be more completely set forth in the following detailed description.

Brief description of the drawing

The following figures illustrate and designate the various steps involved in the practice of this invention as well as the product of this invention.

Description of the preferred embodiments

Figure 1:
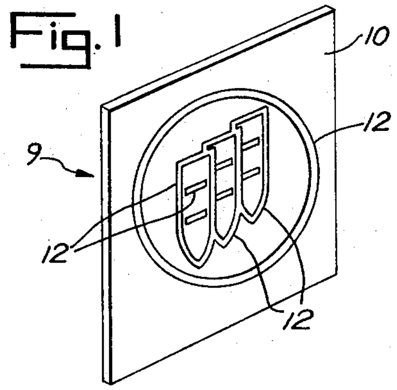
FIG. 1 illustrates, in a perspective view, a bonded product constructed by affixing the applique of the invention to a background support.

A bonded product 9, constructed by utilizing the applique of the invention, is illustrated in FIG. 1. Separate thin metal foil elements 12 have been permanently affixed to a background support 10 in a decorative or functional arrangement to form a design pattern. Any material capable of supporting a decoration can be used as a background support 10. Foil has been successfully bonded to materials such as wood, glass, plastics, cloth, metals and even apples through the use of the principles of the present invention. A commercially important example involves a flexible background support of vinyl with aluminum foil decorations bonded thereto. The bonded vinyl product is used as upholstery in automobiles.

FIGS. 2–7 illustrate the step-wise process of fabricating the bonded product shown in FIG. 1. In the first step, depicted by FIG. 2, a temporary carrier 14 is coated with a temporary adhesive 16. The material chosen as a carrier 14 depends upon the background support 10 which is to be decorated. For example, to apply the trim or decoration to curved surfaces, such as cylinders and spheres, a flexible temporary carrying film, preferably polyvinyl chloride or waterproof cellophane, may be used. For flat surfaces, a non-stretching film such as Mylar or treated paper is preferred. However, any similar material in thin sheet form, usually about 0.003" thick, may be used. Materials suitable as a temporary adhesive 16 include waxes which act as suitable adhesives at room temperature, but which lose their adhering qualities at higher temperatures. Beeswax, for example, has been successfully employed as a temporary bonding agent.

Figures 2, 3, 4, 5, 6, 7:
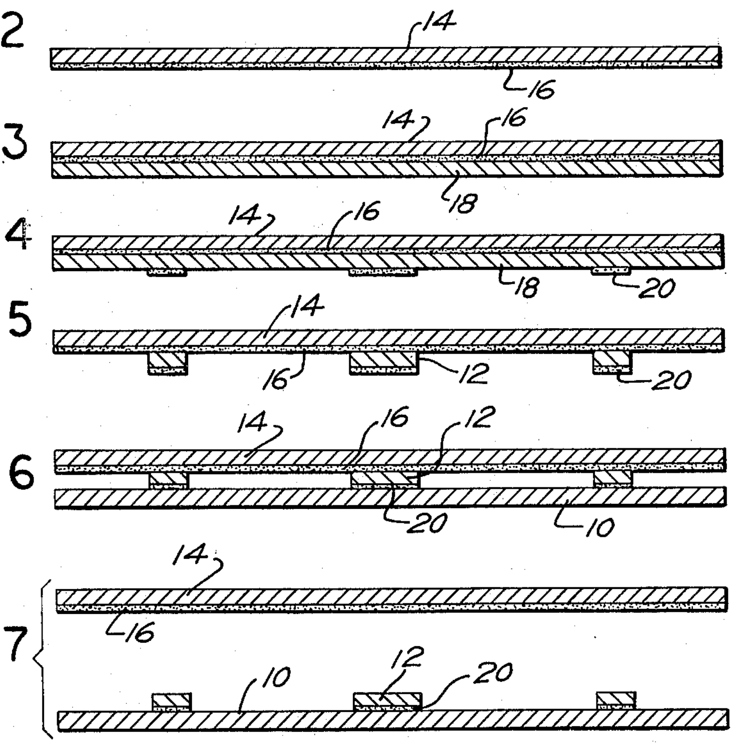
FIGS. 2–7 are cross-sectional views illustrating the sequence of steps in the process for fabricating the bonded product shown in FIG. 1.

In the second step, as illustrated in FIG. 3, a thin, flat metal foil sheet or blank 18 is temporarily adhered to the temporary carrier 14 by means of the temporary adhesive 16. Any foil material that can be etched may be used; however, non-corrosive metals such as aluminum, brass, copper or stainless steel are preferred. The foil may be up to 0.005" thick with serious loss of detail due to undercutting. That is, while any thickness of metal can be used, as the metal gets thicker, the design must become more coarse since undercutting resulting from the etching process will tend to destroy fine details on a thick metal. For finely detailed designs, therefore, it has been found preferable to use foil of about 0.003" thick. Furthermore, the thinner foils, being highly flexible, are more desirable since they can be easily utilized to fabricate flexible design products. In the event that foils greater than 0.005" are desired, there are techniques which prevent undercutting in an etched, detailed design.

In the next step, depicted in FIG. 4, an etch-resistant adhesive 20 is applied to the exposed surface of the metal foil sheet 18. The adhesive 20, which defines the ultimate design desired to be defined by the metal foil sheet 18, is applied to the exposed surface by silk screening, printing or gravure, mask spraying, spot coating or the like. The adhesive 20 acts as a resist in the etching process to follow, and, as will be discussed, it also acts as an adhesive for bonding the design to the final background 10. No special adhesives are required for different metal foils, although they may be required for different backgrounds.

Adhesives which have been employed successfully for application of patterns to vinyl backgrounds include thermosetting rubber resin compositions, rubber resin compositions which do not require heat applications and vinyl base adhesives consisting of a medium molecular weight polyvinyl chloride polymer solution in a ketone solvent blend. Typically a vinyl base adhesive is comprised of 37% by weight (37% solids) of a medium molecular weight polyvinyl chloride and 63% by weight of a ketone blend, the ketone blend consisting of 85% methyl ethyl ketone, 10% cyclohexanon and 5% isopherone. For application to a metal surface, a resist adhesive of a neoprene and phenolic resin solution is used. A suitable solution for metal surface applications includes an 88% neoprene and 12% phenolic resin blend combined with the same ketone blend as set forth above. The neoprene-phenolic resin blend comprises 37% solids portion of the total adhesive solution. The resist is dryed by warming in an oven for two minutes to drive off the solvent.

The following step is shown by FIG. 5. The metal foil sheet or blank 18 is etched or otherwise removed in the portions not defined by the adhesive 20. Metal foil elements 12 covered with a layer of adhesive 20 remain. The etchant used is dependent, of course, upon the metal foil sheet 18.

The applique of FIG. 5 is the subject matter of the appended claims and is useful in preparing a final bonded product as shown in FIGS. 1 and 7. The application of the intermediate stage transfer assembly shown in FIG. 5 to the permanent background 10 is illustrated in FIG. 6. Adhesion may be accomplished by one of several known techniques including the application of pressure alone, of the combination of heat and pressure, or by the combinaton of solvent activation of the adhesive 20 and the application of pressure. The mode of sealing the foil elements 12 (formerly the metal foil sheet 18) to the background 10 depends upon the type of adhesive being used. For example, a thermosetting bonding adhesive requires the use of heat and pressure; whereas, pressure alone is adequate with most other adhesives.

After the assembly of FIG. 5 is bonded to the background material 10, as shown in FIG. 6, the carrier 14 and the temporary adhesive 16 are removed to reveal a final product 9, as shown in FIG. 7. After washing and drying by exposure to warm air, the transfer is completed. It is to be understood, of course, that the exposed side of the metal foil element 12 in the final product is the side of the metal foil sheet 18 which is temporarily adhered to the temporary carrier 14.

If desired, the metal foil sheet 18 can be predecorated by various known means such as printing, screening or anodizing and then adhered temporarily to the carrier 14. Continuing the bonding process ultimately results in a bonded product having predecorated metal foil elements 12 to further enhance the design pattern.

To make a product which encompasses the claimed subject matter more attractive and, more importantly, to protect the adhesive, the manufacturer may position a temporary protective layer such as cellophane over the adhesive layer 20. Of course, the protective layer may cover the entire product of FIG. 5 and thereby protect all the components and prevent drying out and oxidation of the adhesives.

The process and product of the present invention advantageously make it unnecessary to remove a resist after etching and make it unnecessary to apply a permanent bonding adhesive to the pattern. Thus two time-consuming and costly steps have been eliminated from prior art methods. This makes the process especially attractive for large scale production. Moreover, and this is critical, the adhesive, because it also serves as a resist, is in perfect register with the foil of the applique and also completely covers the surface of the applique to be bonded. This insures a complete bond of the applique with no portions of the foil tending to disengage a background support because of a lack of adhesive.

While specific steps and the materials used therein have been set forth in considerable detail for the purpose of illustration, it is to be understood that such details may be varied greatly by those skilled in the art without departing from the spirit of the invention.

What is claimed is:

1. An improved process for providing a design pattern in which metal foil is prepared for adherent application to a background support, said process comprising, in combination, the steps of:

providing a blank metal foil, temporarily adhering one side of the blank to a flexible, resinous carrier, applying a heat-settable, resinous, permanent adhesive-resist in the shape of the desired design pattern to the other side of the metal foil blank, and etching away the portions of the blank that do not carry the design pattern of permanent adhesive-resist, to provide metal foil elements that carry an exposed permanent adhesive while being temporarily adhered to the carrier.

2. A process according to claim 1 and further comprising applying the metal foil design to a compatible background support and permanently bonding the foil design to the background support by heat and pressure, and removing the flexible carrier to expose the design.

3. A process as in claim 1 wherein the metal foil is selected from a group of non-corrosive metals consisting of aluminum, brass, copper and stainless steel, and the metal foil design and flexible temporary carrier are caused to conform with the surface of a background support to which the foil design is then permanently bonded.

4. A process as in claim 3 wherein the selected metal foil is aluminum and the background support to which the foil is bonded is a flexible vinyl member.

References Cited

UNITED STATES PATENTS 3,006,795 10/1961 Brickell -------------- 156—3

JACOB H. STEINBERG, Primary Examiner

U.S. Cl. X.R.

161—406